(12) United States Patent
Ogawa et al.

(10) Patent No.: US 9,024,207 B2
(45) Date of Patent: May 5, 2015

(54) METHOD OF MANUFACTURING A WIRING BOARD HAVING PADS HIGHLY RESISTANT TO PEELING

(71) Applicant: Shinko Electric Industries Co., Ltd., Nagano (JP)

(72) Inventors: Michiro Ogawa, Nagano (JP); Kazuhiro Kobayashi, Nagano (JP); Kentaro Kaneko, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/764,938

(22) Filed: Feb. 12, 2013

(65) Prior Publication Data
US 2013/0185936 A1    Jul. 25, 2013

Related U.S. Application Data

(62) Division of application No. 12/557,847, filed on Sep. 11, 2009, now Pat. No. 8,399,779.

(30) Foreign Application Priority Data

Sep. 12, 2008  (JP) ................................ 2008-234621

(51) Int. Cl.
*H05K 1/11* (2006.01)
*H05K 3/18* (2006.01)
(Continued)

(52) U.S. Cl.
CPC .............. *H05K 3/188* (2013.01); *H01L 21/563* (2013.01); *H01L 21/568* (2013.01);
(Continued)

(58) Field of Classification Search
CPC ......... H05K 1/00; H05K 1/111; H05K 1/112; H05K 1/115; H05K 1/116; H05K 3/06; H05K 3/46; H05K 3/4623; H05K 3/4602

USPC ......... 174/262, 250, 255, 257, 261, 264, 266, 174/267
See application file for complete search history.

(56) References Cited

U.S. PATENT DOCUMENTS 6,490,170 B2   12/2002   Asai et al. ..................... 361/794
6,872,590 B2    3/2005   Lee et al.
(Continued)

FOREIGN PATENT DOCUMENTS

JP   11-074625   3/1999
JP   11-243280   9/1999
(Continued)

OTHER PUBLICATIONS

Notice of Reason for Refusal mailed Jun. 25, 2013 from the Japanese Patent Office in counterpart application No. 2012-184119 with English translation.
(Continued)

*Primary Examiner* — Tremesha S Willis
(74) *Attorney, Agent, or Firm* — Kratz, Quintos & Hanson, LLP (57) ABSTRACT

A wiring board includes a pad exposed from an opening portion of an outermost insulating layer. The pad includes: a first metal layer, a surface of which is exposed from the wiring board; a second metal layer provided on the first metal layer and formed of a material effective in preventing a metal contained in a via inside the board from diffusing into the first metal layer; and a third metal layer provided between the second metal layer and the via, and formed of a material harder to be oxidized than that of the second metal layer. The thickness of the third metal layer is relatively thick, and is preferably selected to be three times or greater than a thickness of the second metal layer. A side surface of the third metal layer and a surface of the third metal layer to which the via is to be connected are roughed.

6 Claims, 10 Drawing Sheets

(51) Int. Cl.
*H01L 21/56* (2006.01)
*H01L 23/498* (2006.01)
*H01L 23/00* (2006.01)
*H05K 3/46* (2006.01)
*H05K 1/03* (2006.01)
*H05K 1/09* (2006.01)
*H05K 3/20* (2006.01)
*H05K 3/24* (2006.01)
*H05K 3/28* (2006.01)
*H05K 3/38* (2006.01)

(52) U.S. Cl.
CPC ... *H01L 23/49816* (2013.01); *H01L 23/49822* (2013.01); *H01L 24/16* (2013.01); *H01L 2224/13099* (2013.01); *H01L 2224/16* (2013.01); *H01L 2224/73203* (2013.01); *H01L 2924/01011* (2013.01); *H01L 2924/01029* (2013.01); *H01L 2924/01046* (2013.01); *H01L 2924/01078* (2013.01); *H01L 2924/01079* (2013.01); *H01L 2924/01082* (2013.01); *H01L 2924/01088* (2013.01); *H01L 2924/15311* (2013.01); *H05K 1/113* (2013.01); *H05K 3/205* (2013.01); *H05K 3/244* (2013.01); *H05K 3/282* (2013.01); *H05K 3/383* (2013.01); *H05K 3/4682* (2013.01); *H05K 2201/09472* (2013.01); *H05K 2201/09563* (2013.01); *H05K 2203/0361* (2013.01); *H01L 2924/01005* (2013.01); *H01L 2924/01006* (2013.01); *H01L 2924/01033* (2013.01); *H01L 2924/01047* (2013.01); *H05K 1/0313* (2013.01); *H05K 1/09* (2013.01); *H01L 2224/16225* (2013.01); *H01L 2224/32225* (2013.01); *H01L 2224/73204* (2013.01)

(56) References Cited

U.S. PATENT DOCUMENTS

| | | | |
|---|---|---|---|
| 7,071,424 B1 | 7/2006 | Shirai et al. | |
| 7,390,974 B2 | 6/2008 | Shirai et al. | |
| 7,397,000 B2 | 7/2008 | Shimoto et al. | |
| 7,435,680 B2 | 10/2008 | Nakamura et al. | 438/678 |
| 7,566,834 B2 | 7/2009 | Shimoto et al. | |
| 7,622,183 B2 | 11/2009 | Shirai et al. | |
| 7,659,193 B2 | 2/2010 | Hu et al. | |
| 7,737,366 B2 | 6/2010 | Shirai et al. | |
| 7,763,969 B2 | 7/2010 | Zeng et al. | |
| 7,906,850 B2 | 3/2011 | Wang et al. | |
| 7,911,038 B2 | 3/2011 | Kikuchi et al. | 257/668 |
| 8,101,868 B2 | 1/2012 | Ito et al. | 174/260 |
| 8,115,111 B2 | 2/2012 | Shirai et al. | |
| 2002/0036337 A1* | 3/2002 | Yi et al. | 257/613 |
| 2005/0067378 A1 | 3/2005 | Fuerhaupter et al. | 216/34 |
| 2006/0252248 A1 | 11/2006 | Hu | 438/613 |
| 2007/0143992 A1* | 6/2007 | Kyouzuka | 29/830 |
| 2008/0122091 A1* | 5/2008 | Gutt et al. | 257/750 |
| 2008/0149383 A1 | 6/2008 | Kaneko et al. | 174/262 |
| 2008/0268632 A1* | 10/2008 | Luh et al. | 438/612 |
| 2009/0095508 A1* | 4/2009 | Park et al. | 174/250 |
| 2011/0136298 A1 | 6/2011 | Kikuchi et al. | 438/121 |
| 2011/0154664 A1 | 6/2011 | Wang et al. | |
| 2012/0103680 A1 | 5/2012 | Shirai et al. | |

FOREIGN PATENT DOCUMENTS

| | | |
|---|---|---|
| JP | 2000-332408 | 11/2000 |
| JP | 2004-214595 | 7/2004 |
| JP | 2005-327780 | 11/2005 |
| JP | 2006-186321 | 7/2006 |
| JP | 2007-173775 | 7/2007 |
| JP | 2008-141070 | 6/2008 |
| WO | WO 2008/001915 | 1/2008 |

OTHER PUBLICATIONS

Japanese Office Action mailed Jul. 3, 2012 with partial English translation (4 pages).

* cited by examiner

METHOD OF MANUFACTURING A WIRING BOARD HAVING PADS HIGHLY RESISTANT TO PEELING

CROSS-REFERENCE TO RELATED APPLICATIONS

This application is a division of U.S. patent application Ser. No. 12/557,847, filed Sep. 11, 2009, which application is based on and claims priority of Japanese Patent Application No. 2008-234621, filed Sep. 12, 2008, the entire contents of which are incorporated herein by reference.

BACKGROUND OF THE INVENTION (a) Field of the Invention

The present invention relates to a wiring board and a manufacturing method of the same. More particularly, the present invention relates to a wiring board including a pad (a portion of a wiring layer) for use in mounting an electronic component such as a semiconductor element (chip) or in bonding an external connection terminal thereto, and to a manufacturing method of the same.

The wiring board is hereinafter also referred to as a "semiconductor package" for the sake of convenience, in the meaning that the wiring board has the role as a package for mounting a semiconductor element (chip) or the like thereon.

(b) Description of the Related Art

In a wiring board, a pad is defined at a predetermined position in a wiring layer, which is, the outermost layer. To this pad, an external connection terminal (such as a solder ball or a pin) for use in mounting the wiring board on a motherboard or the like, or an electrode terminal or the like of a semiconductor element to be mounted on the wiring board is connected. Then, the wiring layer except this pad portion is covered by an insulating layer (typically, a resin layer). Specifically, a corresponding portion of the outermost insulating layer is opened, and the pad is exposed through this opening portion. This pad is formed so that the surface thereof can be flush with the surface of the insulating layer (resin layer), or the surface thereof can be formed at a position recessed from the surface of the insulating layer (resin layer) toward an inner side of the board.

In general, the pad has a layer structure in which multiple metal layers are stacked one on top of another. As the typical layer structure, there is a two-layer structure formed of a gold (Au) layer and a nickel (Ni) layer. The Au layer of this pad is exposed from the insulating layer (resin layer), and a via (which is a conductor filled into a via hole formed on the resin layer in the board and mutually connects the wiring layers) is connected to the Ni layer on this Au layer. This Ni layer is provided for preventing a metal contained in the via (typically, copper (Cu)) from diffusing into the Au layer.

However, since the Ni layer is readily oxidized, there occurs an inconvenience when a wiring board including the aforementioned two-layer (Au/Ni) structure pad, particularly, a wiring board of a type called "coreless board," is fabricated. The basic process of this coreless board includes: preparing a temporary substrate as a support member; then forming a pad on this temporary substrate; then, sequentially forming a required number of build-up layers (resin layers including via holes, wiring layers including inner portions of the via holes); and thereafter, removing the temporary substrate, finally. Specifically, the via is formed and then connected to the Ni layer of the pad after the pad is formed. For this reason, Ni oxide is formed on the surface of the Ni layer after the formation of the pad. As a result, when the via is connected to the Ni layer including the oxide formed thereon, an adhesion between the pad and the via decreases due to influence of the oxide, and electrical connection reliability between the pad and the via is damaged.

The applicant of this application has proposed a technique of coping with the inconvenience. An example of the technique is described in Japanese unexamined Patent Publication (JPP) (Kokai) 2008-141070. In the technique disclosed in this publication, in a wiring board including pads and vias connected to the pads, multiple metal layers stacked one on top of another and forming the pads include: a metal layer (Au layer) exposed from the wiring board; and a metal layer (Ni layer) provided on this metal (Au) layer and preventing a metal contained in the vias from diffusing into the metal (Au) layer. In addition, the multiple metal layers further includes a metal layer (Cu layer) provided between this metal (Ni) layer and the vias, the metal layer (Cu layer) being harder to be oxidized than the metal (Ni) layer. Specifically, a possibility that oxide is interposed between the pads and the vias is practically eliminated by interposing the Cu layer, which is hard to be oxidized, between the vias and the Ni layer. Thereby, the adhesion between the pads and the vias is improved.

Although the technique (the aforementioned publication) for solving the inconvenience observed in the conventional pad having the two-layer (Au/Ni) structure has been proposed as described above, in this technique, nothing is mentioned as to the thickness of each of the metal layers forming the pad and a tensile strength of the pad in particular.

Meanwhile, along with a demand for making a wiring board thinner, a wiring layer and an insulating layer (resin layer) tend to be formed as thin as possible, so that the thickness of the pad to be defined at a portion of the outermost wiring layer needs to be thin as well in accordance with the wring layer. This means that the thickness of each of the metal layers forming the pads described in the aforementioned publication, namely, the thickness of the metal layer (Cu layer) contributing to the improvement in the adhesion with the via becomes thinner as well.

When the thickness of the Cu layer of the pads becomes thin as described above, the surface area of the wall surface of each of the pads, which is in contact with a resin layer (insulating layer) therearound, becomes small, and the adhesion with the resin layer decreases. As a result, a tensile strength when external connection terminals (such as solder balls or pins) or electrode terminals or the like of a semiconductor element are bonded to these pads decreases. Then, a problem that the pads are peeled off depending on circumstances possibly arises. This problem leads to deterioration in performance of the wiring board, and consequently, leads to a decrease in reliability in mounting a semiconductor element or the like on the wiring board or in mounting the wiring board on a motherboard or the like.

The problem of this kind is not necessarily unique to the coreless board, and possibly occurs in the same manner on a wiring board of a type having a core board. Specifically, the aforementioned problem possibly occurs in the same manner on any wiring board which includes a pad formed of multiple metal layers stacked one on top of another as described above and having a structure in which the metal layer (Cu layer) on a side connected to the via is formed with a thin thickness.

SUMMARY OF THE INVENTION

An object of the present invention is to provide a wiring board capable of increasing a tensile strength when an external connection terminal or the like is connected to a pad and of largely decreasing a defective mode such as peeling of the pad, thereby contributing to an improvement in the reliability of mounting, and a manufacturing method of the same.

According to one aspect of the present invention, there is provided a wiring board including a pad exposed from an opening portion of an outermost insulating layer, the pad including: a first metal layer a surface of which is exposed from the wiring board; a second metal layer provided on the first metal layer and formed of a material effective in preventing a metal contained in a via inside the board from diffusing into the first metal layer; and a third metal layer provided between the second metal layer and the via and formed of a material harder to be oxidized than that of the second metal layer, wherein a thickness of the third metal layer is selected to be relatively thick.

In the configuration of the wiring board according to this aspect, the pad is formed of the three-layer structure (the first, second and third metal layers), and the third metal layer, which is harder to be oxidized than the second metal layer is interposed between the second metal layer and the via inside the board. Thus, a possibility that oxide is interposed between the pad and the via is practically eliminated. Thereby, the adhesion between the pad and the via can be improved.

Moreover, the thickness of the third metal layer is provided to be relatively large. Thus, a surface area of the wall surface of the pad (particularly, the wall surface of the third metal layer), which is in contact with the insulating layer (typically, resin layer) therearound, becomes larger, thereby increasing the adhesion. As a result, the tensile strength when an external connection terminal or an electrode terminal of a semiconductor element is bonded to this pad increases. Thus, a defective mode such as the peeling of the pad can be greatly decreased, which in turn leads to an improvement in performance of the wiring board, and specifically, contributes to an improvement in reliability in mounting a semiconductor element or the like on the wiring board, or in mounting the wiring board on a motherboard or the like.

According to another aspect of the invention, there is provided a method of manufacturing a wiring board, including forming, on a support base member, a resist layer having an opening portion formed in a required shape by patterning; forming a pad by stacking first metal layer, a second metal layer and a third metal layer by a plating method on the support base member exposed from the opening portion of the resist layer, the second metal layer being formed of a material effective in preventing a metal contained in a via from diffusing into the first metal layer, the third metal layer being formed of a material harder to be oxidized than that of the second metal layer and having a thickness relatively thick; forming an insulating layer on the pad and the support base member after removing the resist layer; forming, on the insulating layer, a wiring layer including the via connected to the third metal layer; and stacking insulating layers and wiring layers alternately until a required number of layers is reached, and removing the support base member.

With reference to the following embodiments of the invention, descriptions are given below of other features in configuration of the wiring board and the manufacturing method thereof according to the present invention, and characteristic advantages based on the features thereof, and so on.

DESCRIPTION OF THE PREFERRED EMBODIMENTS

Descriptions are given below of preferred embodiments of the present invention with reference to the accompanying drawings.
First Embodiment
FIGS. 1 to 4b FIG. 1 is a cross-sectional view showing a configuration of a wiring board (semiconductor package) according to a first embodiment of the present invention.

Figure 1:
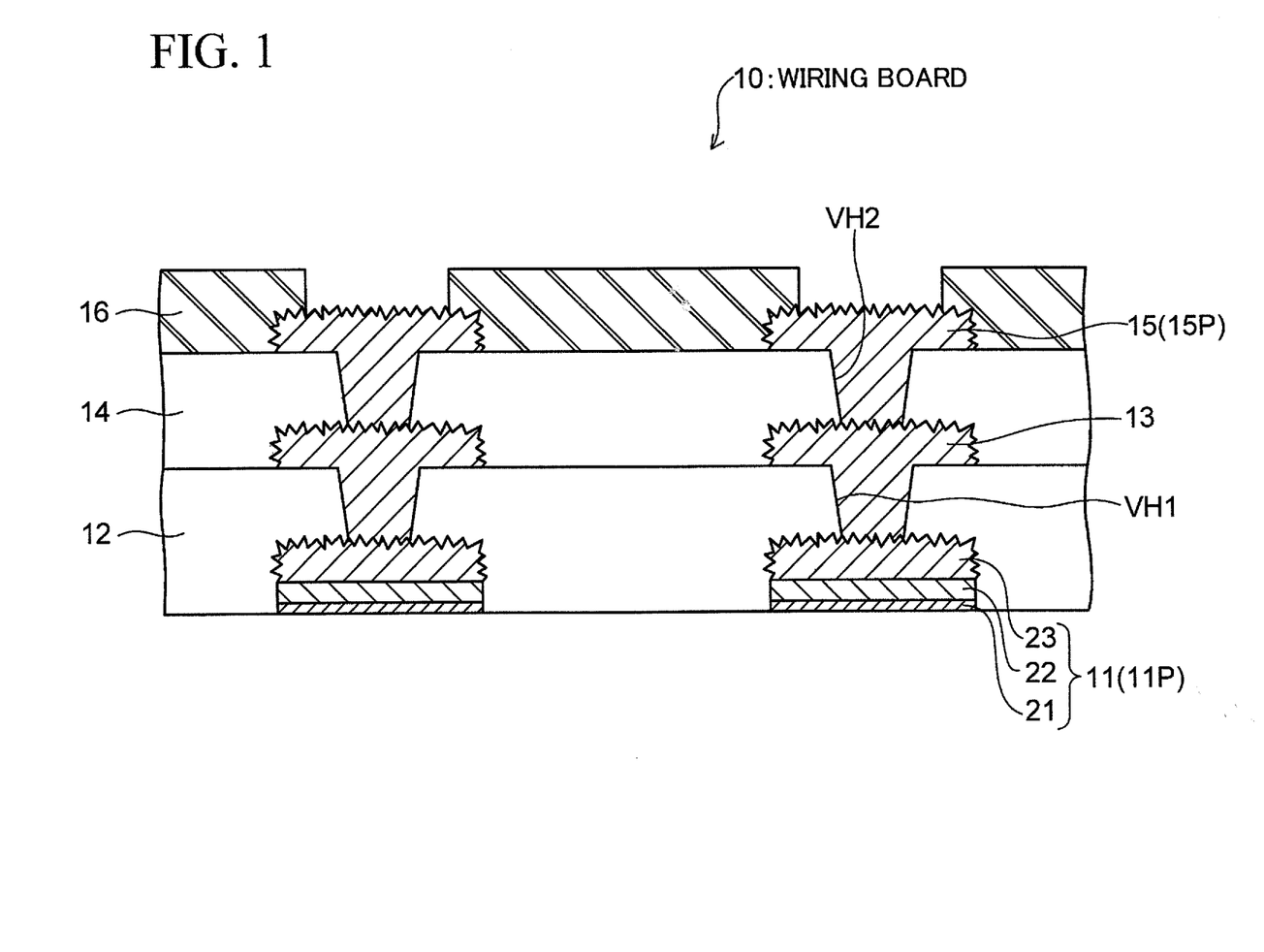
FIG. 1 is a cross-sectional view showing a configuration of a wiring board (semiconductor package) according to a first embodiment of the present invention.

As illustrated, a wiring board 10 according to this embodiment has a structure in which multiple wiring layers 11, 13 and 15 are stacked one on top of another with insulating layers (specifically, resin layers) 12 and 14 interposed therebetween. In this structure, the wiring layers 11, 13 and 15 are interlayer connected via conductors (each being a portion of a material forming a corresponding one of the wiring layers 13 and 15) filled into via holes VH1 and VH2 formed on the insulating layers 12 and 14, respectively. Specifically, the wiring board 10 has the form of a "coreless board," which does not include a support base member and is different from a wiring board fabricated by using a general build-up process (in which a required number of build up layers are sequentially stacked on both surfaces or a single surface of a core board serving as a support base member).

On the surface layer (upper side in the illustrated example) of this coreless board, an insulating layer (solder resist layer) 16 functioning as a protection film is formed so as to cover the surface except for pads 15P each defined at a predetermined position of the outermost wiring layer (wiring layer 15 in the illustrated example). In addition, on a surface on the side (lower side in the illustrated example) opposite to the side on which this insulating layer 16 is formed, pads 11P (each being a portion defined at a predetermined position of the wiring layer 11) which characterize the present invention are exposed, and the pads 11P are formed so that the bottom surfaces thereof can be flush with the bottom surface of the insulating layer (resin layer) 12.

Each of the pads 11P is configured of a three-layer structure in which metal layers 21, 22, and 23 are sequentially stacked one on top of another as illustrated. The metal layer 21 arranged on a side where the pads 11P are exposed from the insulating layer 12 is preferably formed of a material having good contact characteristics (soldering characteristics) because external connection terminals or electrode terminals of a semiconductor element (chip) or the like are directly bonded to these exposed portions. For example, gold (Au), gold/palladium (Au/Pd), tin (Sn) or the like can be used. In a case where a two-layer structure of Au/Pd is used as the metal layer 21, a structure in which an Au layer and a Pd layer are stacked in a manner that the Au layer is exposed to an outside of the wiring board 10 is employed. The side surface of this metal layer 21 is covered by the insulating layer (resin layer) 12.

By being interposed between the metal layers 21 and 23, the metal layer 22 fulfills a function to prevent a metal (typically, copper (Cu)) contained in the via (conductor filled into the via hole VH1) from diffusing into the metal layer 21. As the material for achieving such a function, nickel (Ni) can be used, for example. The side surface of this metal layer 22 is covered by the insulating layer (resin layer) 12.

The metal layer 23 is preferably formed of a material having good electrical conductivity and also being harder to be oxidized than that of the metal layer 22, which is the lower layer thereof because the via (Cu) is directly connected to these portions. For example, copper (Cu), silver (Ag), gold (Au) or the like can be used. The side surface and a portion of the top surface of this metal layer 23 are covered by the insulating layer (resin layer) 12. As described, since the metal layer 23 has a relatively large surface area which is to be in contact with the resin material (insulating layer 12) around the metal layer 23, the metal layer 23 is preferably formed of a material having a good adhesion with resin. In this embodiment, copper (Cu) is used as the material of the metal layer 23 in consideration of these conditions.

Then, in order to achieve a desired purpose of the present invention, the thickness of the Cu layer (metal layer 23) having a good adhesion with resin is formed as thick as possible. The thickness of the Cu layer (metal layer 23) is preferably selected to be three times or greater than the thickness of the Ni layer (metal layer 22) as will be described later.

Moreover, the surface of each of the pads 11P, particularly, the side surface and the top surface of the Cu layer (metal layer 23) formed to have a large thickness, are roughed (roughing), and thereby these surfaces are made in a concave-convex state (portions indicated by jaggy lines in the drawing). Note that, this roughing is performed for the surfaces (side surfaces and top surfaces) of the other wiring layers 13 and 15 as well, as illustrated.

To the pads 15P exposed from the insulating layer (solder resist layer) 16 on an upper side, electrode terminals of a semiconductor element (chip) or the like to be mounted on this wiring board 10 are flip-chip bonded via solder bumps or the like, respectively. To the pads 11P exposed from the insulating layer (resin layer) 12 on a lower side, external connection terminals such as solder balls used in mounting this wiring board 10 on a motherboard or the like are bonded, respectively. Specifically, the surface on the upper side is a chip-mounting surface, and the surface on the lower side is an external connection terminal bonding surface.

However, depending on conditions, situations, or the like where this wiring board 10 is used, the wiring board 10 can be used in a form in which the chip-mounting surface and the external connection terminal bonding surface are upside down. In this case, external connection terminals are bonded to the pads 15P on the upper side, and electrode terminals of a semiconductor element or the like are connected to the pads 11 on the lower side.

Note that, the solder resist layer 16 to be formed on one of the surfaces of this wiring board 10 fulfills a function as a reinforcing layer in addition to the function as a protection film. This wiring board 10 is a coreless board having a low rigidity, and the thickness thereof is also thin, so that it is undeniable that the strength of the board decreases more than a little. However, the solder resist layer 16 is formed on one of the surfaces of the board as illustrated in order to reinforce the board.

The specific material, size, thickness and the like of each of the members forming the wiring board 10 according to this embodiment are specifically described in relation to a process to be described hereinafter.

Next, a description is given of a method of manufacturing the wiring board 10 (FIG. 1) according to this embodiment with reference to FIGS. 2A to 2E and FIGS. 3A to 3D showing an example of the manufacturing steps.

Figure 2A:
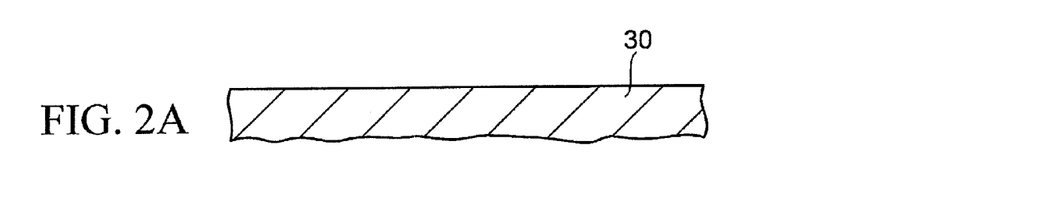
FIGS. 2A to 2E are cross-sectional views showing an example of manufacturing steps of the wiring board in FIG. 1.

First, a support base member 30 is prepared as a temporary board in the initial step (refer to FIG. 2A). As a material for this support base member 30, a metal (typically, copper (Cu)) soluble in an etchant is used in considering that the support base member 30 is eventually etched away as will be described later. Basically, a metal plate or a metal foil is sufficient for use as a form of the support base member 30. Specifically, a structure (for example, the support base member disclosed in Japanese unexamined Patent Publication (JPP) (Kokai) 2007-158174)) obtained by the following manner can be preferably used as the support base member 30. An underlying layer and a copper foil are disposed on a prepreg (e.g., a bonding sheet in a semi-cured B state, formed by impregnating a thermosetting resin such as an epoxy resin or a polyimide resin into a glass fiber which is a reinforcement material) for example, and then heat and pressure are applied to the prepreg to obtain the structure.

In the next step (refer to FIG. 2B), a plating resist is formed on the support base member 30 by using a patterning material, and predetermined portions are opened. These portions to be opened are formed by patterning in accordance with a shape of a required wiring layer (specifically, pads) to be formed. As the patterning material, a photosensitive dry film or a liquid photoresist can be used. For example, in a case where the dry film is used, the surface of the support base member 30 is cleaned, and thereafter, the dry film is attached thereonto by thermal compression bonding. This dry film is cured by subjecting the dry film to exposure under ultraviolet (UV) irradiation by use of a mask (not illustrated) having a pattern of the shape of the required wiring layer. Thereafter, these portions are etched away (opening portions OP) by a predetermined developing solution. Then, a plating resist layer 31 in accordance with the shape of the required wiring layer (pads 11P) is formed. In a case where the liquid photoresist is used, the plating resist layer 31 can be also formed through the same steps.

In the next step (refer to FIG. 2C), the wiring layer 11 is formed on the support base member (Cu) 30 by electrolytic plating using this support base member 30 as a power feeding layer, the support base member (Cu) 30 exposed through the opening portions OP of the plating resist layer 31. These portions (portions defined at the predetermined positions) of the wiring layer 11 function as the pads 11P for bonding external connection terminals (solder ball 20 in FIG. 4A) thereto (or the pads for mounting a semiconductor element (chip) thereon).

Figures 2B, 2C:
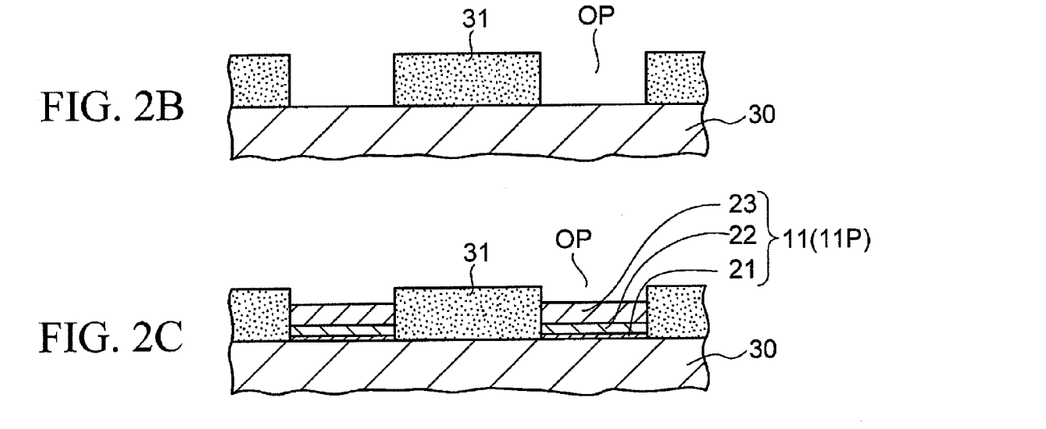
Figure 2D:
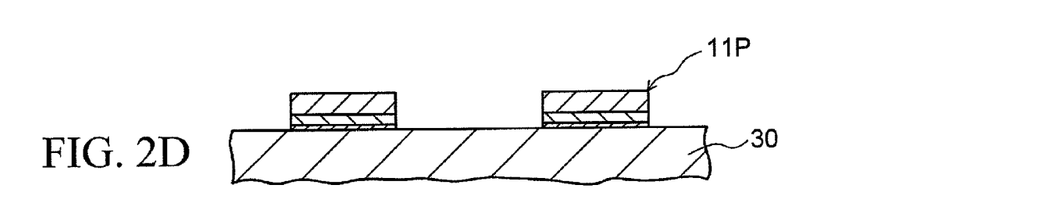
Figure 4A:
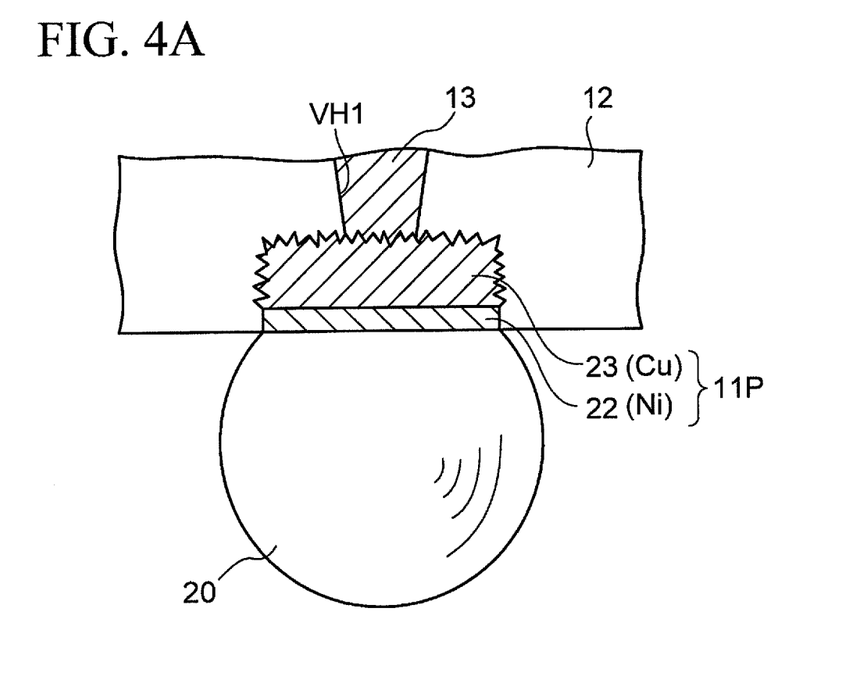
FIGS. 4A to 4B are diagrams for explaining the effect of "improvement in a tensile strength" which can be obtained by the wiring board according to the technique of the invention.

The size (diameter) of each of the pad 11P is selected to be approximately 200 to 1000 μm when the pads 11P are used for bonding external connection terminals thereto, and is selected to be approximately 50 to 150 μm when the pads 11P are used for mounting a chip. Moreover, each of the pads 11P has the structure in which the three metal layers 21, 22 and 23 are stacked one on top of another as described above. Here, a metal species insoluble in an etchant is selected as the material forming the metal layer 21, which is the lowermost layer, in considering that the support member 30 to be in contact with the metal layer 21 is eventually etched away. In this embodiment, since copper (Cu) is used as the material of the support base member 30, gold (Au) is used as a different metal from copper in considering that it can ensure good contact characteristics.

Specifically, an Au layer having a thickness of not less than 5 nm (preferably, 40 nm) is formed first on the support base member (Cu) 30 by flash plating with Au, and a Pd layer having a thickness of not less than 5 nm (preferably, 20 nm) is formed on the Au layer by flash plating with palladium (Pd). Thereby, an Au/Pd layer (metal layer 21) is formed. Next, a Ni layer (metal layer 22) having a thickness of 1 to 10 μm (preferably, 5 μm) is formed on this Au/Pd layer (metal layer 21) by nickel (Ni) plating, and a Cu layer (metal layer 23) having a thickness of 10 to 20 μm (preferably, 15 μm) is formed on the Ni layer (metal layer 22) by copper (Cu) plating. Herein, the Pd layer, which is the upper layer portion of the metal layer 21, is formed in order to prevent oxidation of the Au layer, which is the lower layer portion of the metal layer 21. In addition, the Ni (metal layer 22) layer is formed in order to prevent the Cu contained in the metal layer 23, which is the upper layer thereof, from diffusing into the Au/Pd layer (metal layer 21), which is the lower layer thereof.

Specifically, in this step, the pads 11P (wiring layer 11) formed of a three-layer (four-layer, to be precise) structure of the Au/Pd layer 21, the Ni layer 22 and the Cu layer 23 are formed. Moreover, the thickness of the Cu layer 23 having a good adhesion with resin is formed as thick as possible. The thickness of the Cu layer 23 is preferably formed to be three times or greater than the thickness of the Ni layer 22.

In the next step (refer to FIG. 2D), the dry film resist used as the plating resist layer 31 (FIG. 2C) is removed by use of an alkaline chemical liquid such as sodium hydroxide or a monoethanolamine solution, for example.

In the next step (refer to FIG. 2E), surface processing (roughing) for roughing the surfaces of the pads 11P, which are the upper surface side of the support base member 30, is performed. As a method of roughing, there are etching, oxidation and blast methods. In this embodiment, the required roughing is performed by use of a CZ processing liquid (mixture of formic acid and hydrochloric acid) made by MEC Company Ltd. Specifically, after the processing object (structure shown in FIG. 2D) is immersed in a processing tank containing the CZ processing liquid, or after the CZ processing liquid is sprayed onto the processing object, the processing liquid is washed off by cleaning with water. Thereby, the copper (Cu) surface is roughed.

Figure 2E:
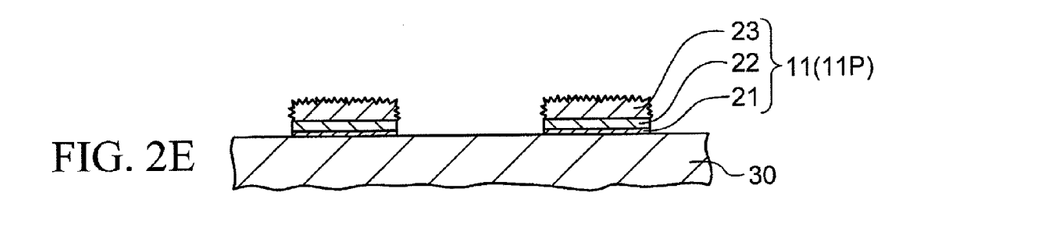

Although a state in which the only top surface and side surface of the upper layer (Cu layer 23) of each of the pads 11P are roughed is shown in the illustrated example, actually, the surface of the support base member (Cu) 30 is also roughed in the same manner. The degree of roughness (Ra) of the copper (Cu) surface after roughing is approximately 0.2 to 1.0 μm. Note that, during this roughing, the Ni layer 22 and the Au/Pd layer 21 on the lower layer side, which partially form the pads 11P, are not influenced by the roughing (in other words, the surfaces thereof are not roughed).

As a method other than the CZ process, a black oxide process or soft etching by spraying an ammonia persulfate solution can be performed. Any of the processes is for enhancing the adhesion between copper (Cu) and resin, and basically, for causing an anchor effect by forming the concave-convex portion on the Cu surface.

In the next step (refer to FIG. 3A), on the pads 11P (wiring layer 11) and the support base member 30, which have been subjected to roughing, the insulating layer 12 is formed so as to expose the pads 11P. Specifically, the insulating layer 12 formed of an epoxy resin, a polyimide resin, or the like is formed on the entire surface, first. For example, an epoxy resin film is laminated on the support base member 30 and the wiring layer 11 (pads 11P), and then, this resin film is cured by heat processing at a temperature of 130 to 150° C. while the resin film is pressed. Thereby, the insulating layer 12 can be formed.

Figure 3A:
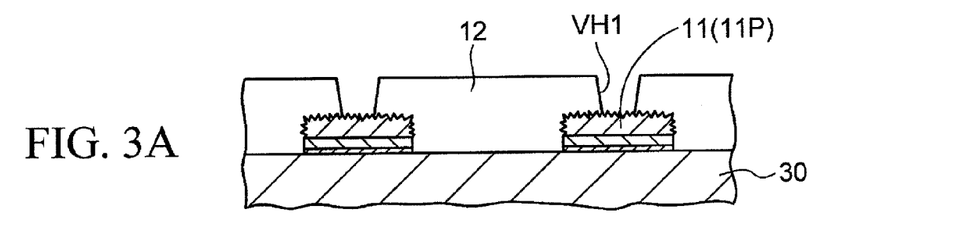
FIGS. 3A to 3D are cross-sectional views showing manufacturing steps subsequent to the steps in FIGS. 2A to 2E.

Next, opening portions (via holes VH1) which extend to the pads 11P are formed at predetermined positions (portions corresponding to the pads 11P) of this insulating layer 12, respectively, by a hole making process with a $CO_2$ laser, an excimer laser or the like. Note that, the insulating layer 12 can be formed by patterning a photosensitive resin film by photolithography, or can be formed by patterning a resin film provided with opening portions, by screen printing.

In the next step (refer to FIG. 3B), by the filling of the via holes VH1, the required wiring layer (pattern) 13 to be connected to the wiring layer 11 (pads 11P) is formed on the insulating layer 12 having the via holes VH1 formed therein. A semi-additive process, for example, is used for formation of the wiring layer 13. Specifically, first, a copper (Cu) seed layer (not illustrated) is formed on the insulating layer 12 and also in the via holes VH1 by electroless plating, sputtering or the like. Then, a resist film (not illustrated) is formed, which includes opening portions in accordance with the shape of the wiring layer 13 to be formed. Next, on the seed (Cu) layer exposed through the opening portions of this resist film, a conductor (Cu) pattern (not illustrated) is formed by electrolytic copper (Cu) plating using this seed layer as a power feeding layer. Furthermore, the seed layer is etched by using the conductor (Cu) pattern as the mask after the resist film is removed. Thereby, the required wiring layer 13 is obtained. Note that, other than the aforementioned semi-active process, various wiring forming methods including a subtractive process and the like can be used.

Figure 3B:
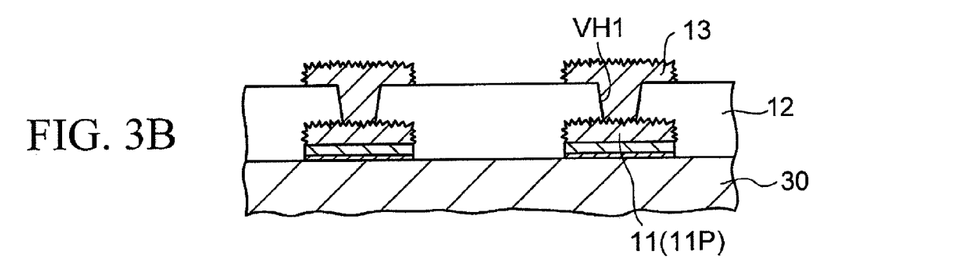

After the required wiring layer 13 is formed in the aforementioned manner, the surfaces (side surface and top surface) of the wiring layer 13 is subjected to roughing in the same manner as the process performed in the step shown in FIG. 2E.

In the next step (refer to FIG. 3C), the insulating layers and the wiring layers are alternately stacked in the same manner as the process performed in the steps shown in FIGS. 3A and 3B. In the illustrated example, one insulating layer and one wiring layer are stacked for the simplicity of description. Specifically, the insulating layer (resin layer) 14 is formed on the insulating layer (resin layer) 12 and the wiring layer 13. Then, the via holes VH2 extending to the pad portions (not illustrated) of the wiring layer 13, respectively, are formed on this insulating layer 14. Thereafter, the required wiring layer (pattern) 15 is formed on the insulating layer 14 and also in these via holes VH2. This wiring layer 15 forms the outermost wiring layer in this embodiment.

Figure 3C:
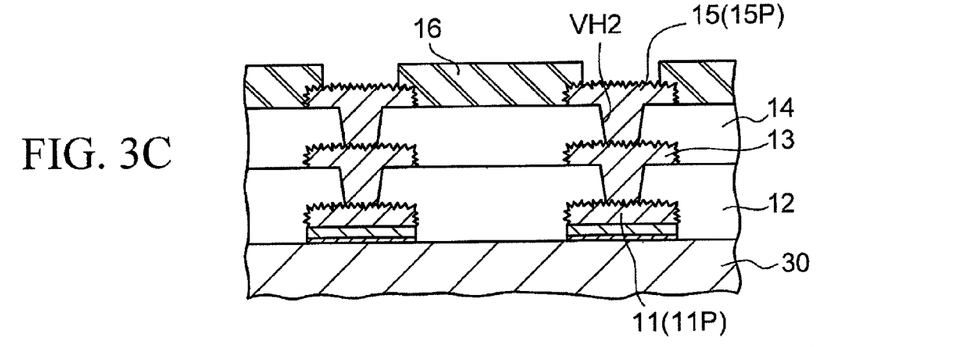

Furthermore, the solder resist layer 16 is formed so as to cover the surface (insulating layer 14 and wiring layer 15) except for the pads 15P defined at predetermined positions, respectively, of this wiring layer 15, which is the outermost layer. This solder resist layer 16 can be formed by use of the same technique as the process performed in the step shown in FIG. 2B. Specifically, a photosensitive dry film resist is laminated, or a liquid photoresist is applied, and then, this resist is formed into a required shape by patterning. In this manner, the solder resist layer 16 can be formed. Thereby, the pads 15P are exposed through the opening portions of the solder resist layer 16.

Since electrode terminals of a semiconductor element or the like to be mounted, or external connection terminals such as solder balls or pins for use in mounting the wiring board 10 on a motherboard are bonded to the pads 15P, it is preferable that the pads 15P be subjected to Au plating for the purpose of improving contact characteristics. At this time, electroless Ni plating is performed on the pads (Cu) 15P, and then electroless Au plating is performed thereon. Specifically, a conductive layer (not illustrated) having a two-layer structure including the Ni layer and the Au layer is formed on the pads 15P.

In the last step (refer to FIG. 3D), the support base member 30 used as a temporary board (FIG. 3C) is selectively removed with respect to the pads 11P, the resin layer 12, the pads 15P and the solder resist layer 16. For example, by wet etching using a ferric chloride aqueous solution, a copper chloride aqueous solution, an ammonium persulfate aqueous solution or the like, the support base member (Cu) 30 can be selectively etched away with respect to the pads 11P (the Au/Pd layer 21 is formed on the surface layer portions thereof), the resin layer 12, the pads 15P (the Au layer is formed on the surface layer portions thereof) and the solder resist layer 16.

Through the aforementioned steps, the wiring board 10 (FIG. 1) of this embodiment is fabricated.

As described above, according to the wiring board (semiconductor package) 10 and the manufacturing method thereof according to the first embodiment (FIGS. 1 to 3D), the following effects can be obtained. The pads 11P are formed of the three-layer structure including the Au/Pd layer (metal layer 21), the Ni layer (metal layer 22) and the Cu layer (metal layer 23). In addition, the Cu layer 23, which is harder to be oxidized than the Ni layer 22, is interposed between the Ni layer 22 and the vias (conductor filled into the via holes VH1 and formed of a portion of the material (Cu) forming the wiring layer 13). Thus, substantially, there is no possibility that oxide is interposed between the pads 11P and the vias. Thereby, the adhesion between the pads 11P and the vias can be improved.

Furthermore, in this embodiment, the Cu layer (metal layer 23) having a good adhesion with resin is formed to have a thickness as thick as possible. Thus, the surface area of the wall surface of each of the pads 11P (particularly, the Cu layer 23), which is in contact with resin layer (insulating layer 12) therearound, becomes larger, and thereby, the adhesion with the resin layer increases. Thus, the tensile strength when an external connection terminals (such as a solder ball or a pin) or an electrode terminals of a semiconductor element are bonded to these pads 11P is increased, so that a defective mode such as the peeling of the pads can be largely decreased. This advantage leads to an improvement in performance of the wiring board 10, and consequently, contributes to an improvement in reliability in mounting a semiconductor element or the like on the wiring board 10, or in mounting the wiring board 10 on a motherboard or the like.

Moreover, in this embodiment, the surfaces (particularly, the side surface and the top surface of the Cu layer 23) of the pads 11P are subjected to roughing, so that the adhesion between the pads 11P and resin layer (insulating layer 12) therearound can be effectively increased.

In addition, the one of the surfaces of the wiring board 10 is covered by the solder resist layer 16. Thereby, the entire board is reinforced, which in turn leads to a suppression of warpage of the entire board. Thus, handling ease at the time of mounting is improved.

Figure 4B:
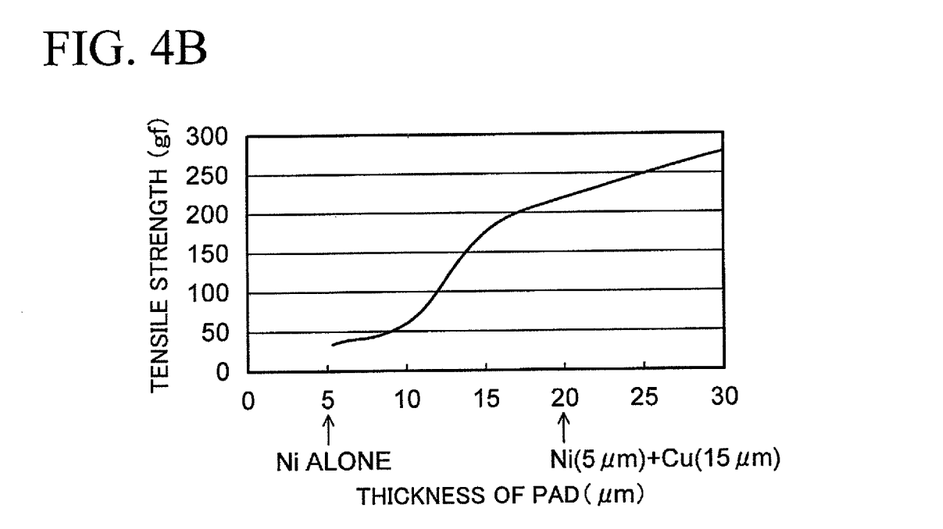

FIGS. 4A and 4B show an effect of "improvement in tensile strength" which can be obtained by the wiring board (particularly, the wiring board 10 shown in FIG. 1) according to the technique of the invention. In the drawings, FIG. 4A is an enlarge view of a neighborhood portion of the pad 11P on the wiring board 10. In the illustrated example, a state in which a solder ball 20 as an external connection terminal is bonded to this pad 11P is shown. As to the Au/Pd layer 21 (FIG. 1), which forms the lowermost layer of the pad 11P, the illustration thereof is omitted herein because the thickness thereof is extremely thin as compared with those of the other layers, which are the Ni layer 22 and the Cu layer 23. In addition, FIG. 4B shows an aspect of change in the tensile strength (gf) with respect to the thicknesses of each pad when the thickness (μm) of each pad is changed.

As shown in the result of an experiment shown in FIG. 4B, the degree of adhesion (tensile strength) with the resin layer 12 increases as the thickness of the Cu layer formed on the Ni layer (5 μm) is set to be larger. In particular, the tensile strength notably increases at the point where the thickness of the Cu layer is set approximately 12 to 13 μm (the sum of the thicknesses of the Ni layer and the Cu layer is 17 to 18 μm). Incidentally, according to current techniques, the sum of the thicknesses of the Ni layer and the Cu layer is only 14 to 15 μm, and the tensile strength at this time is approximately 150 gf. However, in this embodiment, the thickness of the Cu layer is selected to be not less than 15 μm (the sum of the thicknesses of the Ni layer and the Cu layer is not less than 20 μm), so that it is possible to improve the tensile strength to be equal to or greater than 220 gf. As seen from the illustrated example, a sufficient adhesion in practical use can be obtained when the sum of the thicknesses of the Ni layer and the Cu layer is approximately 20 to 30 μm.

Second Embodiment

FIGS. 5 to 7d

Figure 5:
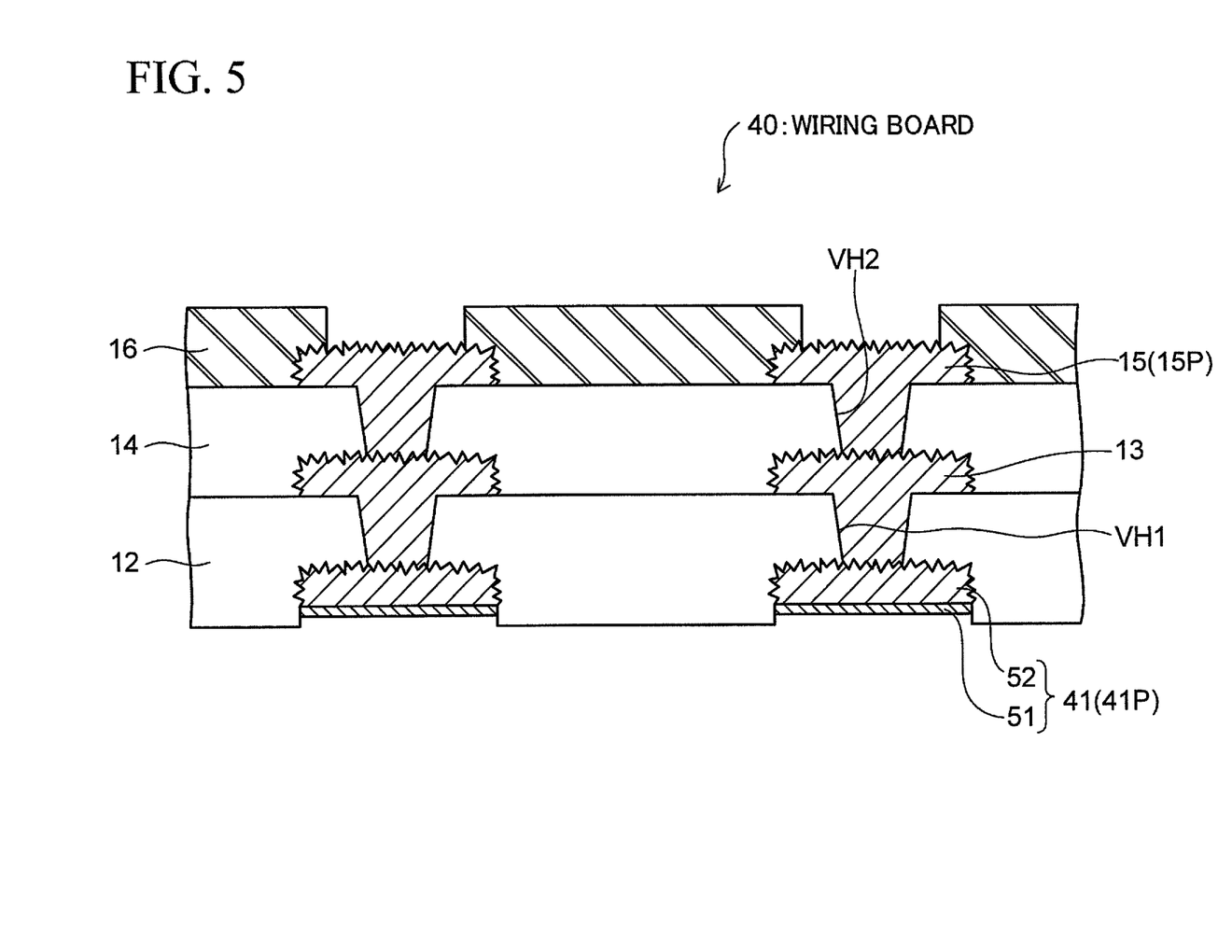
FIG. 5 is a cross-sectional view showing a configuration of a wiring board (semiconductor package) according to a second embodiment of the present invention.

FIG. 5 is a diagram showing a configuration of a wiring board (semiconductor package) according to a second embodiment of the present invention in a form of a cross sectional view.

As compared with the configuration of the wiring board 10 (FIG. 1) according to the first embodiment, a wiring board 40 according to this embodiment is different in the following points. First, the lower surface of each of pads 41P, which is exposed from the lower side of the insulating layer (resin layer) 12, is formed to be at a position recessed toward an inner side of the board from the lower surface of the insulating layer (resin layer) 12. In addition, each pad 41P is formed of a two-layer structure in which a film (OSP film 51) of water-soluble pre-flux formed on the basis of an OSP (Organic Solderbility Preservative) process, and a metal layer 52 are stacked in layers. In this configuration, the OSP film 51 corresponds to the Au/Pd layer 21 of the pads 11P according to the first embodiment, and the metal layer 52 corresponds to the Cu layer 23 of the pads 11P. Specifically, the two-layer structure of this embodiment is different from the conventional two-layer (Au/Ni) structure in that the two-layer structure of this embodiment does not include the material (Ni), which is readily oxidized. Since the other configuration thereof is the same as that of the wiring board 10 of the first embodiment, the description thereof is omitted herein.

The wiring board 40 according to this embodiment can be fabricated by a manufacturing method shown in FIGS. 6A to 7D as an example. The process performed in each of steps in FIGS. 6A to 7D is basically the same as the process performed in each of the steps (FIGS. 2A to 3D) of the manufacturing method according to the first embodiment. In order to avoid a duplicate description, descriptions are only given of different processes.

Figure 6A:
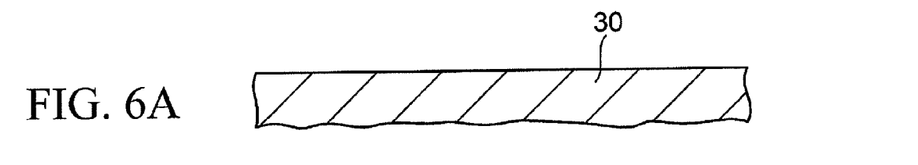
FIGS. 6A to 6E are cross-sectional views showing an example of manufacturing steps of the wiring board in FIG. 5.
Figure 6B:
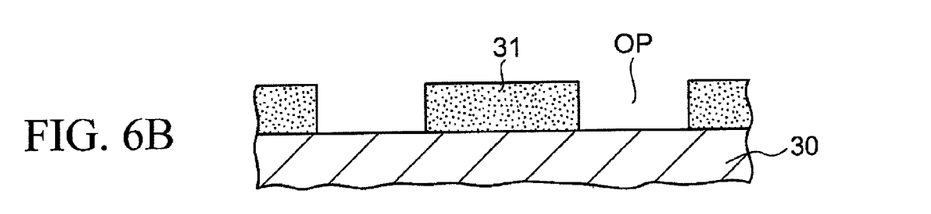

First, the support base member 30 serving as a temporary board is prepared (FIG. 6A) in the same manner as the process performed in the steps in FIGS. 2A and 2B. Then, a plating resist layer 31 including opening portions OP at predetermined positions are formed (FIG. 6B).

In the next step (refer to FIG. 6C), on the support base member (Cu) 30 exposed through the opening portions OP of the plating resist layer 31, a metal layer 22 (functioning as a sacrifice conductive layer) is formed by electrolytic plating using this support base member 30 as a power feeding layer. On this metal layer 22, an upper layer portion (metal layer 52) of each of the pads 41P formed of a portion of a wiring layer 41 is formed. The size (diameter) of each pad 41P is selected to be approximately 200 to 1000 μm for use in bonding an external connection terminal thereto, and is selected to be approximately 50 to 150 μm for use in mounting a chip thereon, as in the case of the first embodiment.

Figure 6C:
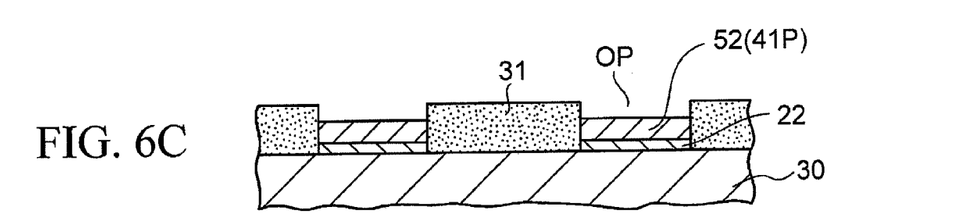
Figure 6D:
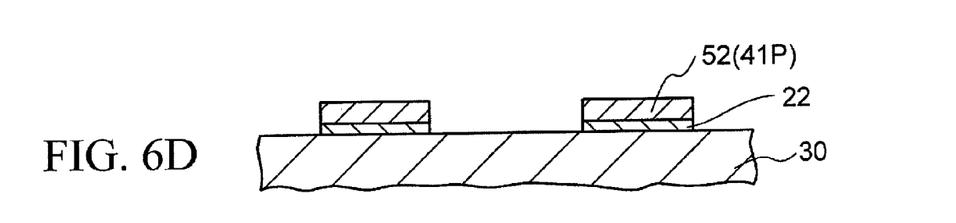
Figure 6E:
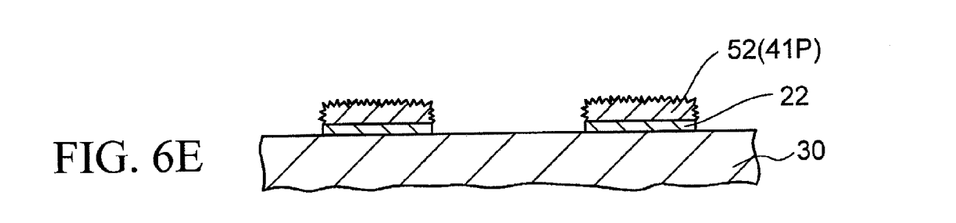
Figure 7A:
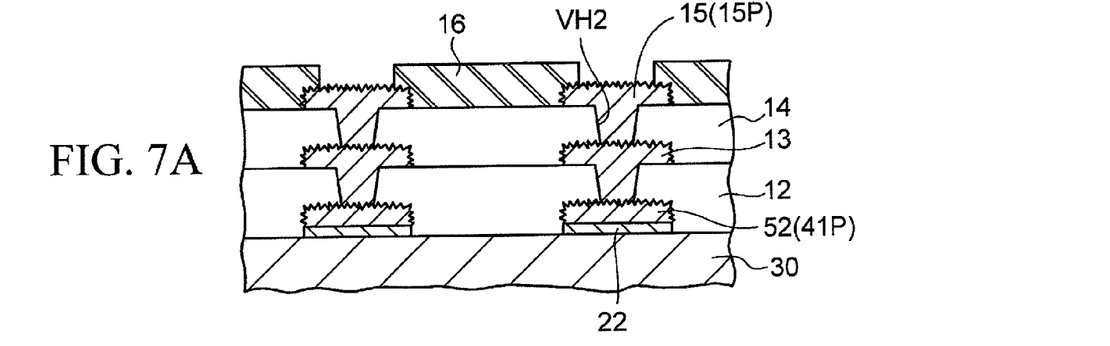
FIGS. 7A to 7D are cross-sectional views showing manufacturing steps subsequent to the steps in FIGS. 6A to 6E.
Figure 7B:
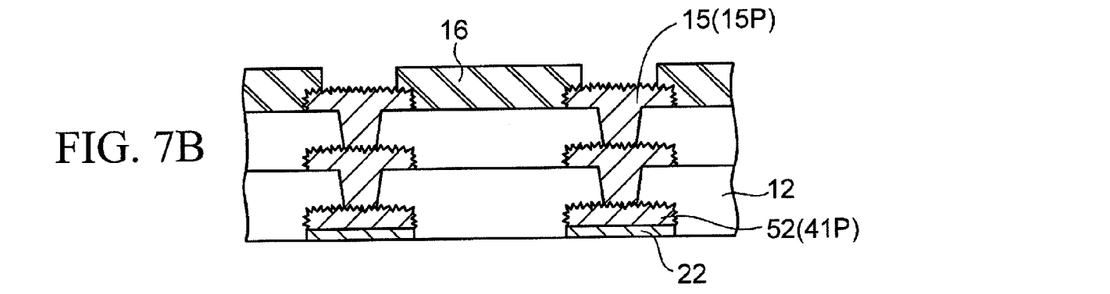
Figure 7C:
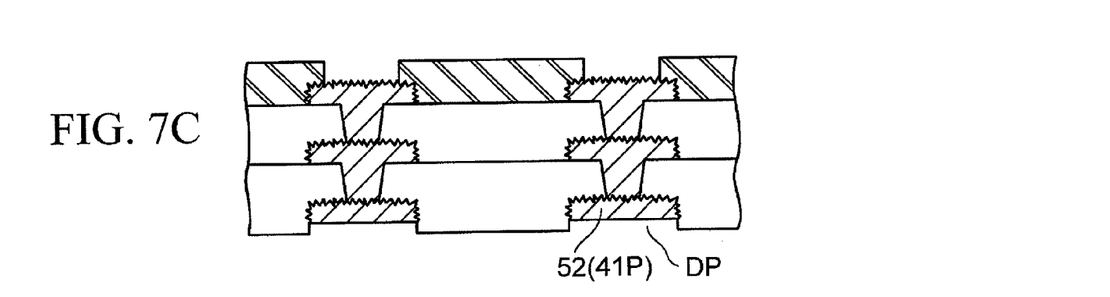
Figure 7D:
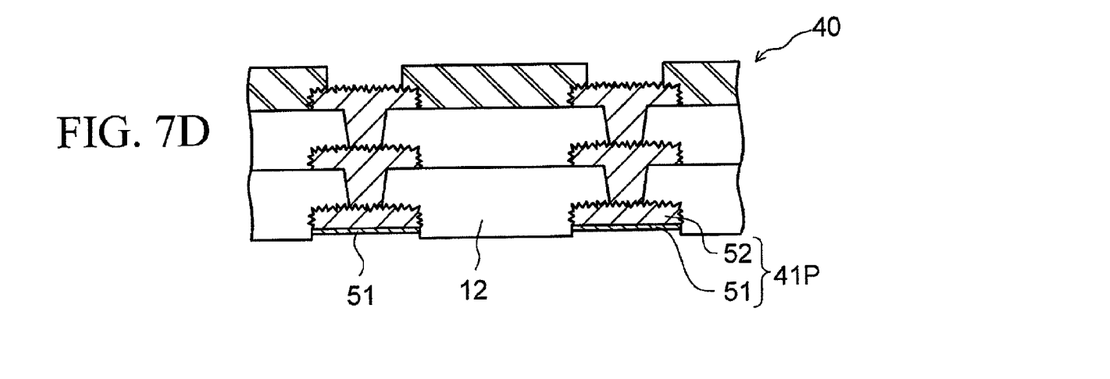

Specifically, first, a Ni layer (metal layer 22) having a thickness of 1 to 10 μm (preferably, 5 μm) is formed on the support base member (Cu) 30 by nickel (Ni) plating, and then, a Cu layer (metal layer 52) having a thickness of 10 to 20 μm (preferably, 15 μm) is further formed on this Ni layer (metal layer 22) by copper (Cu) plating. This Cu layer 52 is formed so as to have a thickness as thick as possible as in the case of the Cu layer 23 (FIG. 2C) in the first embodiment. The Cu layer 52 is preferably formed so as to have a thickness of three times or greater than the thickness of the Ni layer 22. Note that, the Ni layer 22 formed in this step is eventually etched away, which is different from that in the case of the first embodiment.

Next, the process in steps in FIGS. 6D and 6E, and FIGS. 7A and 7B is performed in the same manner as the process performed in the steps in FIGS. 2D and 2E, and FIGS. 3A to 3C and FIG. 3D.

Figure 3D:
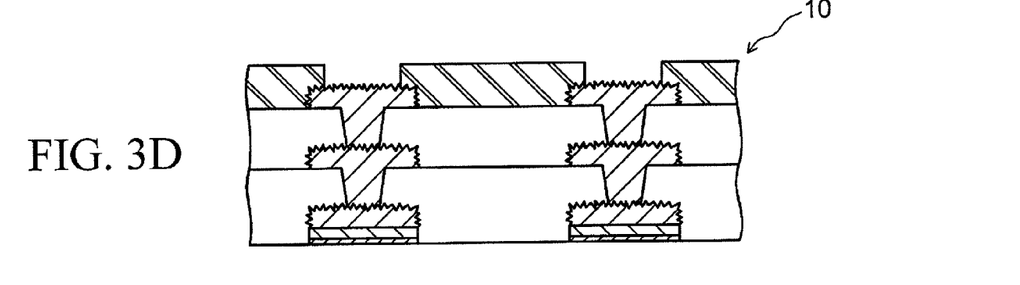

In the next step (refer to FIG. 7C), using the same technique as that used in the processing performed in the step shown in FIG. 3D, the Ni layer 22 (FIG. 7B) exposed from the lower side of the resin layer 12 is selectively removed with respect to the Cu layer 52, the resin layer 12, the pads 15P, and the solder resist layer 16. Thereby, a concave portions DP in accordance with the thickness of the removed Ni layer 22 are formed as shown in the drawing. The bottom surface of the Cu layer 52, which is the upper layer portions of the pads 41P, is thereby exposed at these concave portions DP.

In the last step (refer to FIG. 7D), by performing the OSP process on the exposed Cu layer 52 (the upper layer portions of the pads 41P), a film (OSP film 51) formed of water-soluble pre-flux is formed. Because of the formation of this OSP film 51, high soldering characteristics for the pads 41P can be maintained. In this manner, as illustrated, the bottom surface (the bottom surface of the OSP film 51, which is the lower layer portion of each of the pads 41P) of each of the pads 41P exposed from the lower side of the insulating layer (resin layer) 12, is formed at a position recessed from the bottom surface of the insulating layer 12 toward an inner side of the board.

Through the steps described above, the wiring board 40 (FIG. 5) of this embodiment is fabricated.

In this wiring board (semiconductor package) 40 and the manufacturing method thereof (FIGS. 5 to 7D) according to the second embodiment, the same operational effects as those of the first embodiment can be brought into effect because the basic configuration and process are the same as those in the case of the first embodiment (FIGS. 1 to 3D).

Third Embodiment

Figure 8:
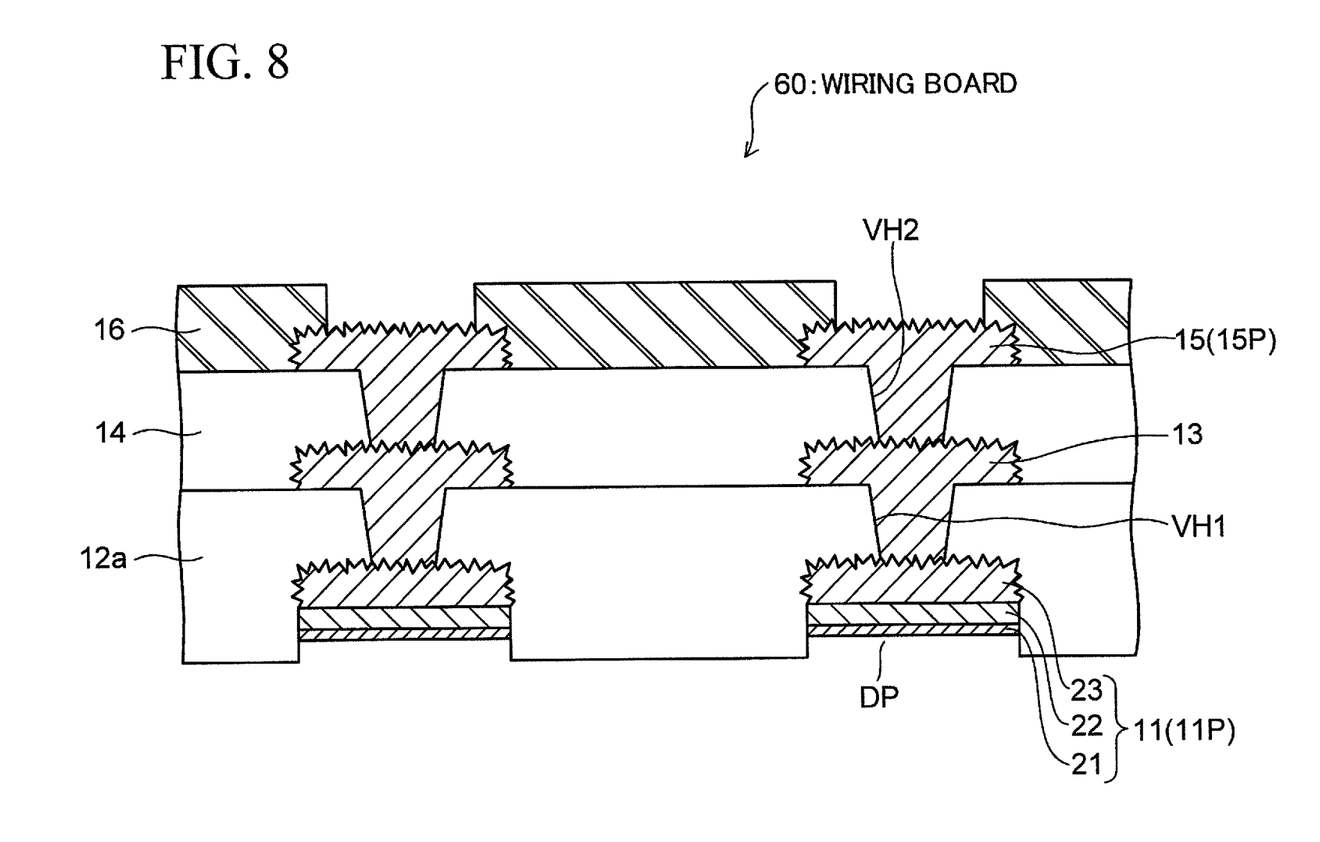
FIG. 8 is a cross-sectional view showing a configuration of a wiring board (semiconductor package) according to a third embodiment of the present invention.
Figure 9A:
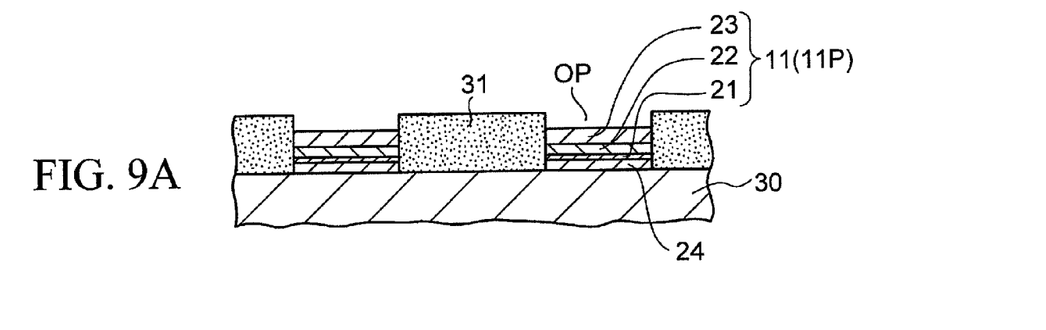
FIGS. 9A to 9C are cross-sectional views showing an example of manufacturing steps of the wiring board in FIG. 8.
Figure 9B:
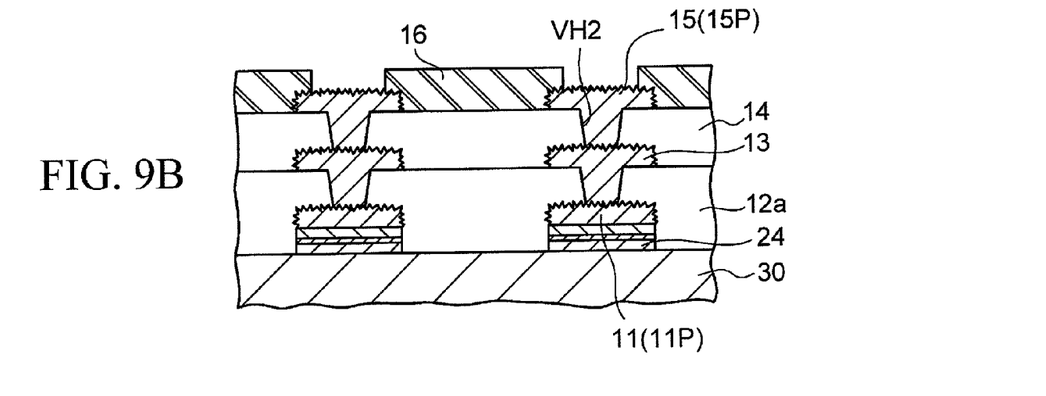
Figure 9C:
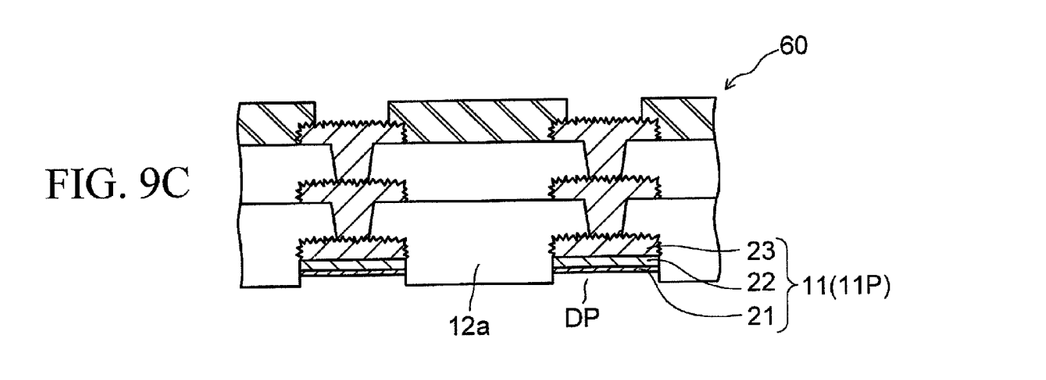

FIGS. 8 to 9c

FIG. 8 shows a configuration of a wiring board (semiconductor package) according a third embodiment of the present invention in a form of a cross-sectional view.

As compared with the configuration of the wiring board 10 (FIG. 1) according to the first embodiment, a wiring board 60 according to this embodiment is different in a point that the bottom surface of each of the pads 11P (the bottom surface of the metal layer 21) which is exposed from the lower side of an insulating layer (resin layer) 12a is formed to be at a position recessed from the bottom surface of the insulating layer (resin layer) 12a toward an inside of the board (specifically, the concave portions DP are formed at these portions of the resin layer 12a, and the metal layer 21 of the pads 11P is exposed at these concave portions DP). Since the other configuration thereof is the same as that of the wiring board 10 of the first embodiment, the description thereof is omitted herein.

The wiring board 60 according to this embodiment can be fabricated by a manufacturing method shown in FIGS. 9A to C as an example. In the example shown in FIGS. 9A to C, only steps related to this embodiment are selected and shown, but the steps are basically the same as those in the manufacturing method (FIGS. 2A to 3D) according to the first embodiment.

First, the support base member 30 serving as a temporary board is prepared in the same manner as the process performed in the steps in FIGS. 2A and B. Then, the plating resist layer 31 including the opening portions OP at predetermined positions are formed on this support base member 30.

In this state, in the step shown in FIG. 9A, on the support base member (Cu) 30 exposed through the opening portions OP of the plating resist layer 31, a metal layer 24 (which functions as the sacrifice conductive layer in this embodiment) is formed by electrolytic plating using this support base member 30 as a power feeding layer. Moreover, on this metal layer 24, the pads 11P (wiring layer 11) are formed by sequentially stacking the Au/Pd layer 21, the Ni layer 22 and the Cu layer 23 in the same manner as the process performed in the step in FIG. 2C. The size (diameter) of each of the pads 11P is the same as those in the case of the first embodiment (for bonding an external connection terminal: approximately, 200 to 100 μm, and for mounting a chip: approximately, 50 to 150 μm).

As the material forming the metal layer (sacrifice conductive layer) 24, which is the lowermost layer, to be formed in this step, a metal species soluble in an etchant is selected in considering that the metal layer 24 and the support base member 30 in contact therewith are eventually etched away. In this case, copper (Cu) is selected as the material forming the metal layer 24. In addition, the thickness of the Cu layer 24 is determined in accordance with the required depth of the concave portion DP (FIG. 8), and is formed to be a thickness of approximately 10 to 20 μm, for example.

Next, in the step in FIG. 9B, the plating resist layer 31 is removed, and roughing is performed on the surface of the pads 11P. Then, the insulating layer 12a (including via holes) is formed. The wiring layer 13 is formed by the filling of these via holes, and after the insulating layer 14 and wiring layer 15 are alternately stacked, the solder resist layer 16 is formed. The process described above is performed in the same manner as the process performed in the steps in FIGS. 2D and 2E and FIGS. 3A, 3B and 3C.

Next, in the step shown in FIG. 9C, the support base member 30 (FIG. 9B) and the sacrifice conductive layer 24 are removed simultaneously. Specifically, by the same technique as that used in the process performed in the step of FIG. 3D (wet etching using a ferric chloride aqueous solution, a copper chloride aqueous solution or the like), the support base member (Cu) 30 and the sacrifice conductive layer (Cu) 24 are selectively etched away with respect to the pads 11P (the Au/Pd layer 21 is formed on the surface layer portion thereof), the resin layer 12a, the pads 15P (the Au layer is formed on the surface layer portion thereof) and the solder resist layer 16. Thereby, the concave portions DP in accordance with the thickness of the removed sacrifice conductive layer 24 are formed as illustrated, and the lowermost layers (Au/Pd layer 21) of the pads 11P are exposed at this concave portion DP. Specifically, the bottom surface of each of the pads 11P (bottom surface of the Au/Pd layer 21) exposed from the lower side of the resin layer 12a is formed at a position recessed from the bottom surface of the resin layer 12a toward an inner side of the board.

Through the steps described above, the wiring board 60 (FIG. 8) of this embodiment is fabricated.

In this wiring board (semiconductor package) 60 and the manufacturing method thereof (FIGS. 9A to 9C) according to the third embodiment, the same operational effects as those of the first embodiment can be brought into effect because the basic configuration and process are the same as those in the case of the first embodiment (FIGS. 1 to 3D).

Figure 10A:
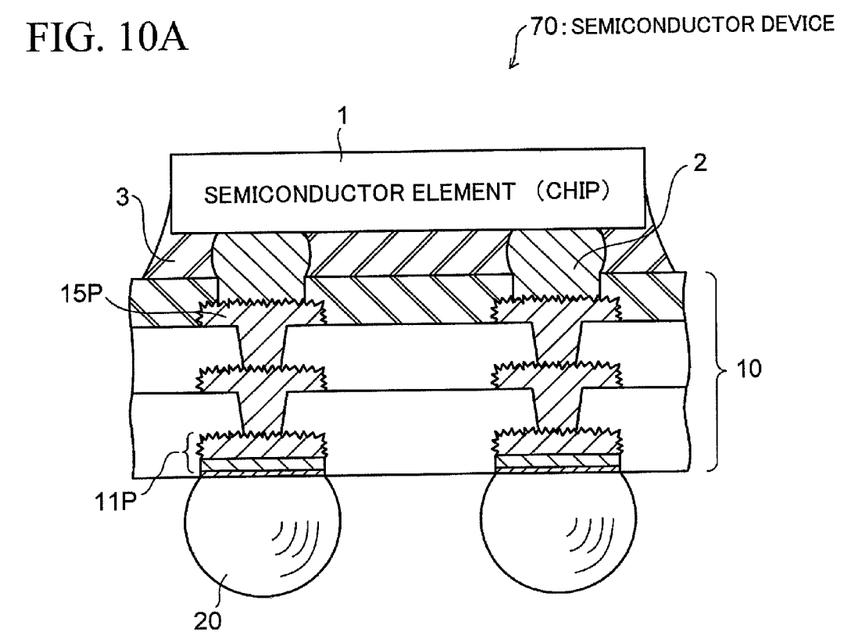
FIGS. 10A and 10B are cross-sectional views each showing a configuration when a semiconductor element is mounted on the wiring board according to the first embodiment.
Figure 10B:
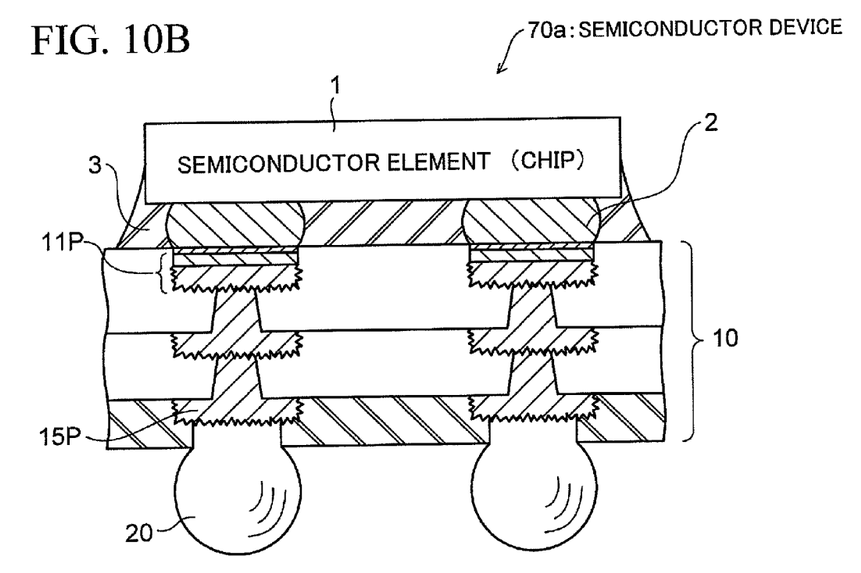

To each of the aforementioned wiring boards 10, 40 and 60 according to the respective first, second and third embodiments, an electrode terminals of a semiconductor element (chip) or the like are bonded to the pads exposed from one of the surfaces of the board, and external connection terminals are bonded to the pads exposed from the other one of the surfaces in accordance with conditions, situations or the like where a corresponding one of the wiring board is used. FIG. 10 is a diagram showing a configuration example of this case.

In the example shown in FIGS. 10A and B, a cross-sectional view of a state in which a semiconductor element (chip) 1 is mounted on the wiring board 10 according to the first embodiment, namely, when configured as a semiconductor device 70 (70a) is shown. The semiconductor chip 1 can be mounted on a surface side where the pads 15P of the wiring board 10 are formed as shown in FIG. 10A (in this case, solder balls 20 are bonded to the pads 11P on the surface at the opposite side thereof, respectively), or can be mounted on the surface side where the pads 11P of the wiring board 10 are formed as shown in FIG. 10B (in this case, the solder balls 20 are bonded to the pads 15P on the surface at the opposite side thereof, respectively). Note that, reference numeral 2 denotes electrode terminals of the semiconductor element 1, and reference numeral 3 denotes underfill resin filled between the wiring board 10 and the semiconductor chip 1 mounted thereon.

In each of the examples shown in FIGS. 10A and B, the state in which the semiconductor chip 1 is mounted on the wiring board 10 according to the first embodiment is exemplified. However, without limitation to this configuration, the semiconductor chip 1 can be mounted on each of the wiring boards 40 and 60 according to the respective second and third embodiments in the same manner, as a matter of course.

Furthermore, the illustrated examples show the form of a BGA (ball grid array) in which the solder balls 20 are bonded to the pads 11P (or 15P), respectively. However, it is possible to employ the form of a PGA (pin grid array) in which pins are bonded to the pads, respectively, or the form of an LGA (land grid array) in which the pads themselves are made to be external connection terminals, as well.

In addition, in each of the aforementioned first, second and third embodiments, the description is given of the case where a "coreless board" not including a support base member is used as the form of each of the wiring boards 10, 40 and 60, as an example, but as is apparent from the gist of the present invention, the form of each of the wiring boards 10, 40 and 60 is not limited to the coreless board as a matter of course. In short, as long as the wiring board has the structure in which a pad is formed of multiple metal layers, and a metal layer on the side to which a via is connected is a Cu layer, the present invention can be applied in the same manner to the wiring board having a core board.

What is claimed is:

1. A method of manufacturing a wiring board, comprising:
   forming a sacrificial conductive layer and a metal layer on a support base member by a plating method;
   roughing a surface and a side surface of the metal layer;
   forming an insulating layer made of a resin on the support base member to cover the metal layer and the sacrificial conductive layer;
   forming an opening portion in the insulating layer to expose the metal layer;
   forming, on the insulating layer, a wiring layer including a via connected to the metal layer;
   removing the support base member and the sacrificial conductive layer to form a concave portion in accordance with the thickness of the removed sacrificial conductive layer in the insulating layer and expose the metal layer in the concave portion; and
   forming a film on the metal layer which is exposed from the insulating layer by performing an OSP (Organic Solderbility Preservative) process to the metal layer,
   wherein a pad is formed of the film and the metal layer.

2. The method of manufacturing a wiring board according to claim 1, wherein the forming a wiring layer includes forming a seed layer on a surface of the insulating layer, which includes an inner surface of the opening portion, and forming, by an electrolytic plating using the seed layer as a power feeding layer, the via with winch the opening portion is tilled and the wiring layer which is formed integrally with the via on the insulating layer.

3. The method of manufacturing a wiring board according to claim 1, wherein, the metal layer is formed of a copper layer.

4. The method of manufacturing a wiring board according to claim 1, wherein thickness of the metal layer is at a range of 10 μm to 20 μm.

5. The method of manufacturing a wiring board according to claim 1, wherein the roughing the metal layer includes performing at least one of etching of the metal layer, oxidation thereof and blast thereof.

6. The method of manufacturing a wiring board according to claim 1, wherein surface roughness of each of the surface and the side surface of the metal layer is at a range of 0.2 μm to 1.0 μm in the roughing the metal layer.

* * * * *